United States Patent
Kim et al.

(10) Patent No.: US 8,391,023 B2
(45) Date of Patent: Mar. 5, 2013

(54) DISPLAY APPARATUS, BASE CHASSIS, AND MANUFACTURING METHOD THEREOF

(75) Inventors: Hong-jin Kim, Suwon-si (KR); Jin-yong Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 243 days.

(21) Appl. No.: 12/897,319

(22) Filed: Oct. 4, 2010

(65) Prior Publication Data

US 2011/0090624 A1   Apr. 21, 2011

(30) Foreign Application Priority Data

Oct. 19, 2009   (KR) .................. 10-2009-0099261

(51) Int. Cl.
*H05K 9/00*   (2006.01)

(52) U.S. Cl. ......... 361/816; 361/818; 361/809; 361/810

(58) Field of Classification Search ............. 361/679.01, 361/681, 704, 707, 708, 715, 807, 809, 810, 361/816, 818, 800; 174/35 R, 51; 313/582–587, 313/643
See application file for complete search history.

(56) References Cited

U.S. PATENT DOCUMENTS

| 7,394,186 | B2 * | 7/2008 | Kim | 313/46 |
| 7,505,270 | B2 * | 3/2009 | Kim | 361/704 |
| 7,595,977 | B2 * | 9/2009 | Kim | 361/679.01 |
| 7,659,667 | B2 * | 2/2010 | Kim | 313/582 |
| 8,218,325 | B2 * | 7/2012 | Song | 361/752 |
| 2006/0044745 | A1 | 3/2006 | Kim | |
| 2006/0152905 | A1 | 7/2006 | Kim et al. | |
| 2006/0154498 | A1 | 7/2006 | Jeong et al. | |
| 2006/0158845 | A1 | 7/2006 | Kim | |
| 2006/0202912 | A1 | 9/2006 | Shin | |
| 2007/0076396 | A1 | 4/2007 | Kim | |
| 2008/0266772 | A1 | 10/2008 | Kim | |
| 2010/0142177 | A1 * | 6/2010 | Lee et al. | 361/829 |
| 2012/0092562 | A1 * | 4/2012 | Omiya et al. | 348/725 |

FOREIGN PATENT DOCUMENTS

| EP | 2 136 611 A1 | 12/2009 |
| KR | 10-2008-0011960 A | 2/2008 |
| KR | 10-2008-0037391 A | 4/2008 |

OTHER PUBLICATIONS

Communication dated May 16, 2011, issued by the European Patent Office in counterpart European application No. 10187997.1.

* cited by examiner

*Primary Examiner* — Hung S Bui
(74) *Attorney, Agent, or Firm* — Sughrue Mion, PLLC

(57) ABSTRACT

A display apparatus is provided. The display apparatus includes a display panel; a base chassis which is disposed on a surface of the display panel, includes a first surface having a convex area and a second surface opposite the first surface and having a concave area corresponding to the convex area of the first surface; a driving circuit which is connected to the display panel to operate the display panel; a connection element which attaches the driving circuit to the convex area of the first surface of the base chassis; and a conductor which is attached to the concave area of the second surface of the base chassis.

16 Claims, 9 Drawing Sheets

DISPLAY APPARATUS, BASE CHASSIS, AND MANUFACTURING METHOD THEREOF

CROSS-REFERENCE TO RELATED APPLICATION

This application claims priority from Korean Patent Application No. 10-2009-0099261, filed Oct. 19, 2009 in the Korean Intellectual Property Office, the disclosure of which is incorporated herein by reference in its entirety.

BACKGROUND

1. Field

Apparatuses and methods consistent with exemplary embodiments relate to a display apparatus, a base chassis and a manufacturing method thereof, and more particularly, to a display apparatus to reduce EMI emission, a base chassis, and a manufacturing method thereof.

2. Description of the Related Art

Flat display apparatuses are used for portable devices. Further, the display apparatuses are rapidly replacing cathode ray tube (CRT) displays due to development of the display technology in the large display field.

One of the shortcomings of display panels is that a large electromagnetic wave noise is generated while the display panels are operating, thereby causing electromagnetic interference (EMI) emission.

EMI causes electromagnetic wave noise interruption which may obstruct reception of a desired electromagnetic signal, thereby causing malfunctioning of an electronic device. In addition, EMI is absorbed in a human body as electronic energy and thus raises body temperature, thereby damaging bodily tissues and functions.

Therefore, there is a need for reducing EMI while operating a display panel.

SUMMARY

Exemplary embodiments may address at least the above problems and/or disadvantages and other disadvantages not described above. Also, exemplary embodiments are not required to overcome the disadvantages described above, and an exemplary embodiment may not overcome any of the problems described above.

Exemplary embodiments provide a display apparatus capable of reducing EMI emission by attaching a conductor to a base chassis, the base chassis, and a manufacturing method thereof.

According to an aspect of an exemplary embodiment, there is provided a display apparatus including a display panel, a base chassis which is disposed on a rear surface of the display panel and is manufactured in a pressing manner to have a concave area and a convex area, a driving circuit which is connected to the display panel to operate the display panel and is attached to the convex area on a rear surface of the base chassis through a connection element, and a conductor which is attached to the concave area.

The conductor may cover a space formed by the concave area and may be attached to the concave area to block EMI emitted through the connection element.

The EMI may be noise generated by the driving circuit when the driving circuit drives the display panel, and the EMI may be transmitted to the connection element and be emitted using the connection element as an antenna.

There may be a plurality of concave areas and a plurality of convex areas, and the conductor may be attached to a concave area corresponding to the convex area to which the driving circuit is attached through the connection element, from among the plurality of concave areas.

The display apparatus may be a plasma display apparatus, and the conductor may be attached to a concave area corresponding to a convex area to which an X driving circuit and a Y driving circuit in the driving circuit are attached through the connection element, from among the plurality of concave areas.

The conductor may include at least one of a conductive gasket tape, a copper tape, and a metal plate.

The pressing manner may be a burring manner.

The connection element may be a conductive screw which is inserted from the convex area to the concave area, may protrude within a space formed by the concave area, and may not protrude outside the space formed by the concave area.

According to an aspect of another exemplary embodiment, there is provided a base chassis which accommodates a display panel and a driving circuit which constitute a display apparatus, the base chassis including a convex area which is manufactured in a pressing manner and in which the driving circuit is mounted through a connection element, and a concave area which corresponds to the convex area and to which a conductor is attached to block EMI generated by the driving circuit when the EMI is emitted through the connection element.

The connection element may be inserted from the convex area, protrude from the concave area, and have the characteristics of a parabolic antenna to emit the EMI from the concave area.

According to an aspect of another exemplary embodiment, there is provided a method for manufacturing a base chassis, the method including manufacturing the base chassis in a pressing manner so that the base chassis has a concave area and a convex area, and attaching a conductor to the concave area of the base chassis to block EMI emitted through a connection element when the driving circuit is mounted in the convex area of the base chassis through the connection element.

BRIEF DESCRIPTION OF THE DRAWINGS

The above and/or other aspects will become more apparent by describing certain exemplary embodiments with reference to the accompanying drawings, in which.

DETAILED DESCRIPTION OF EXEMPLARY EMBODIMENTS

Figure 1:
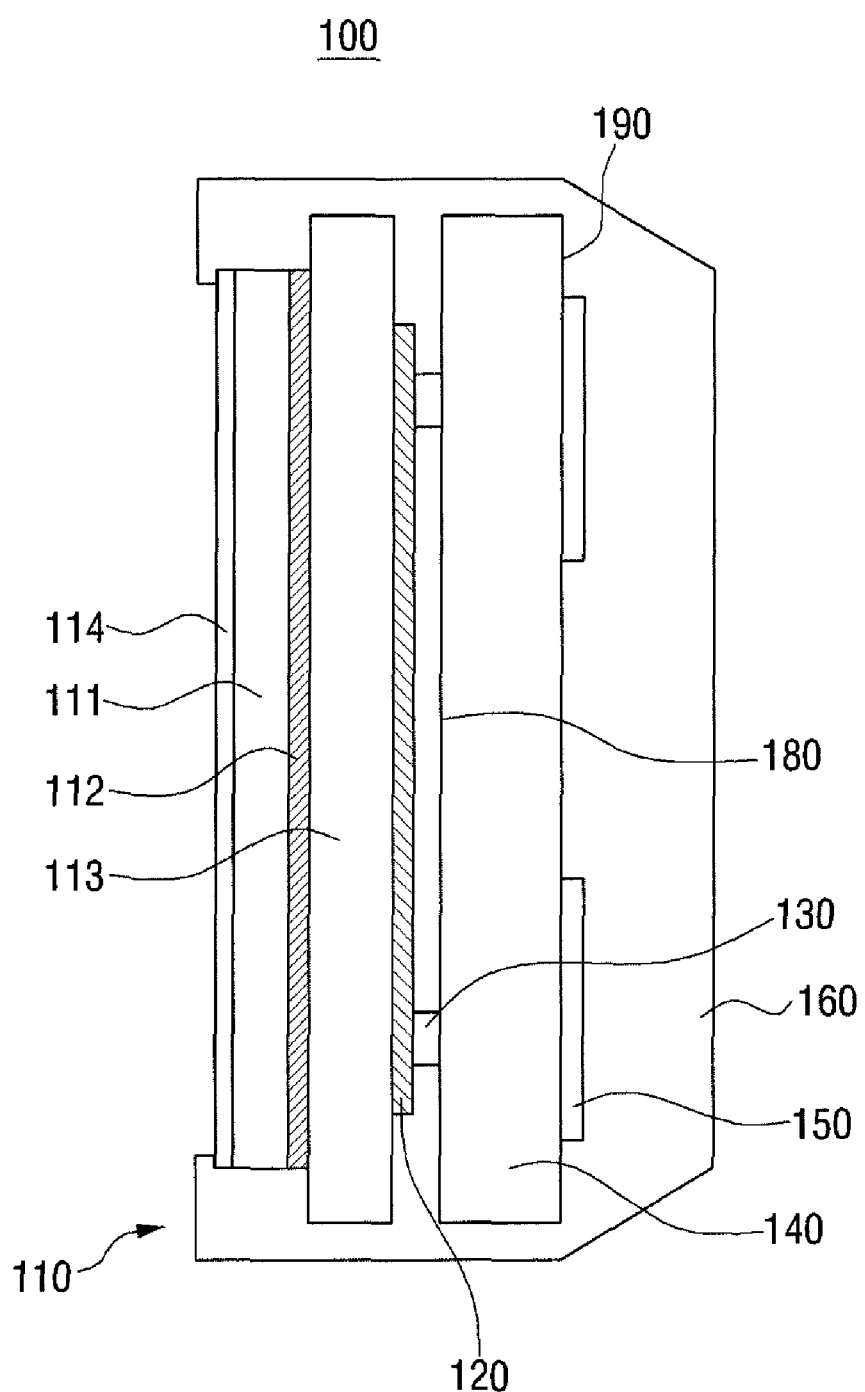
FIG. 1 is a side-sectional view of a plasma display apparatus according to an exemplary embodiment.

Certain exemplary embodiments are described in greater detail below with reference to the accompanying drawings.

In the following description, like drawing reference numerals are used for the like elements, even in different drawings. The matters defined in the description, such as detailed construction and elements, are provided to assist in a comprehensive understanding of exemplary embodiments. However, exemplary embodiments can be practiced without those specifically defined matters.

Figure 2:
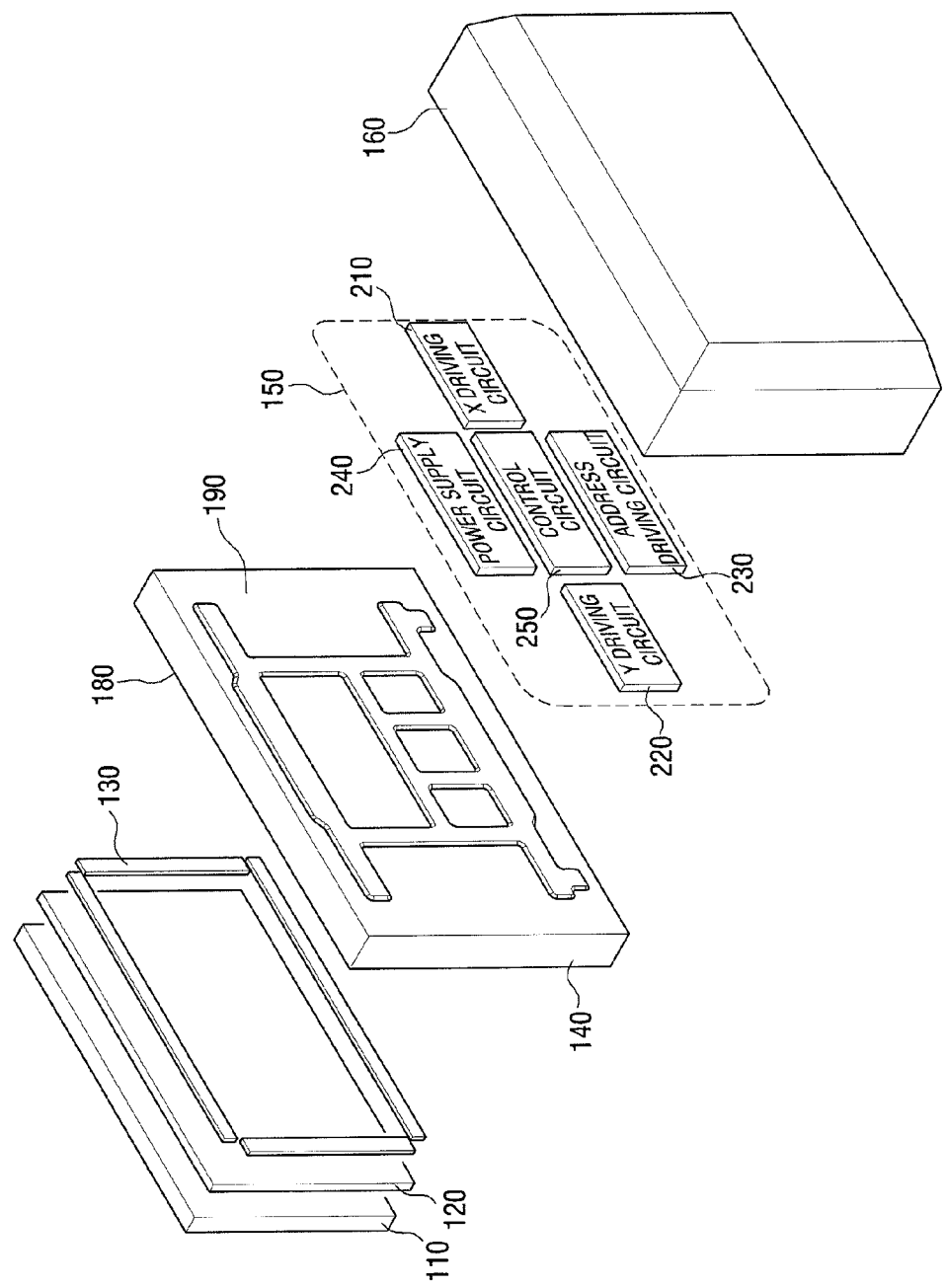
FIG. 2 is a partially exploded perspective view of the plasma display apparatus.

FIG. 1 is a side-sectional view of a plasma display apparatus 100 according to an exemplary embodiment, and FIG. 2 is a partially exploded perspective view of the plasma display apparatus 100. The plasma display apparatus 100 meets electromagnetic wave standard for EMI and provides a viewer with viewable images.

The plasma display apparatus 100 may include a panel 110, a thermal spread sheet (TSS) 120, a gasket 130, a base chassis 140, a driving circuit 150, and a cover 160.

The panel 110 generates an image by exciting a fluorescent substance using a vacuum ultraviolet rays generated by internal gas electric discharge. The panel 110 may include an upper panel 111 and a lower panel 113. The edge of the upper panel 111 is connected to the edge of the lower panel 113 using a sealing substance 112 such as frit so as to form a single panel 110. A plurality of discharge cells are formed in a space between the upper panel 111 and the lower panel 113 sealed by the sealing substance 112, and each discharge cell is filled with Ne and Xe.

In each discharge cell, electrodes which are connected to the driving circuit 150 are arranged. When the driving circuit 150 supplies the voltage to the electrodes, the plasma display apparatus 100 operates. Detailed description of a method for operating the plasma display apparatus 100 is provided below.

A glass filter 114 is attached to or coated on an upper surface of the upper panel 111 for surface reflection prevention, color correction, near infrared ray absorption, EMI blocking, etc. The glass filter 114 may be formed as a single filter layer or as a plurality of filter layers which differ from each other according to their functions.

A filter layer for surface reflection prevention may prevent the viewer from viewing glare and prevent scratches and static electricity on the surface. A filter layer for color correction and color purity improvement prevents light having a wavelength between 580 nm and 590 nm from being provided to the viewer to enhance a color correction range and correct white deviation.

A filter layer for near infrared ray absorption prevents light having a wavelength between 800 nm and 1200 nm from being emitted to the viewer to prevent malfunctioning of the plasma display apparatus 100 by interference with a wavelength band of a remote control. A filter layer for EMI blocking reduces EMI emitted toward the front surface of the panel 110.

The TSS 120 is attached onto the rear surface of the lower panel 113 to prevent degradation of image quality caused by transmitting heat generated in the plasma display apparatus 100 only to a specific portion of the panel 110. That is, the TSS 120 is used to dissipate heat from the plasma display apparatus 100.

In addition, the TSS 120 is connected to the base chassis 140 through the gasket 130 to block EMI. That is, since energy of a driving wave causing discharge emits EMI using the electrodes on the panel 110 as an antenna by the voltage and the current which are applied to the X electrodes and the Y electrodes, the TSS 120 is connected to the base chassis 140 through the gasket 130 to reduce EMI emission. The TSS 120 may be implemented as an E-Graf.

In this exemplary embodiment, the TSS 120 is used to dissipate heat and block EMI, but this is merely an example. Even when a sheet to dissipate heat and a sheet to block EMI are separately provided, technical idea of the inventive concept can be applied. Furthermore, if it is not necessary to dissipate heat or if heat can be dissipated by other methods, only a sheet to block EMI may be provided.

In order to connect the TSS 120 with the base chassis 140, the gasket 130 may be formed of a bondable substance. In particular, in order to transmit the electric current from the TSS 120 to the base chassis 140, the gasket 130 is formed of a conductive material such as a metal fabric. That is, the gasket 130 connects the TSS 120 and the base chassis 140 electrically so that the base chassis 140 can be used as the ground and a return path can be formed between the TSS 120 and the base chassis 140.

The base chassis 140 accommodates the driving circuit 150, and grounds the electric current generated by the driving circuit 150. The shapes of the base chassis 140 are described in detail with reference to FIGS. 3 and 4.

Figure 3:
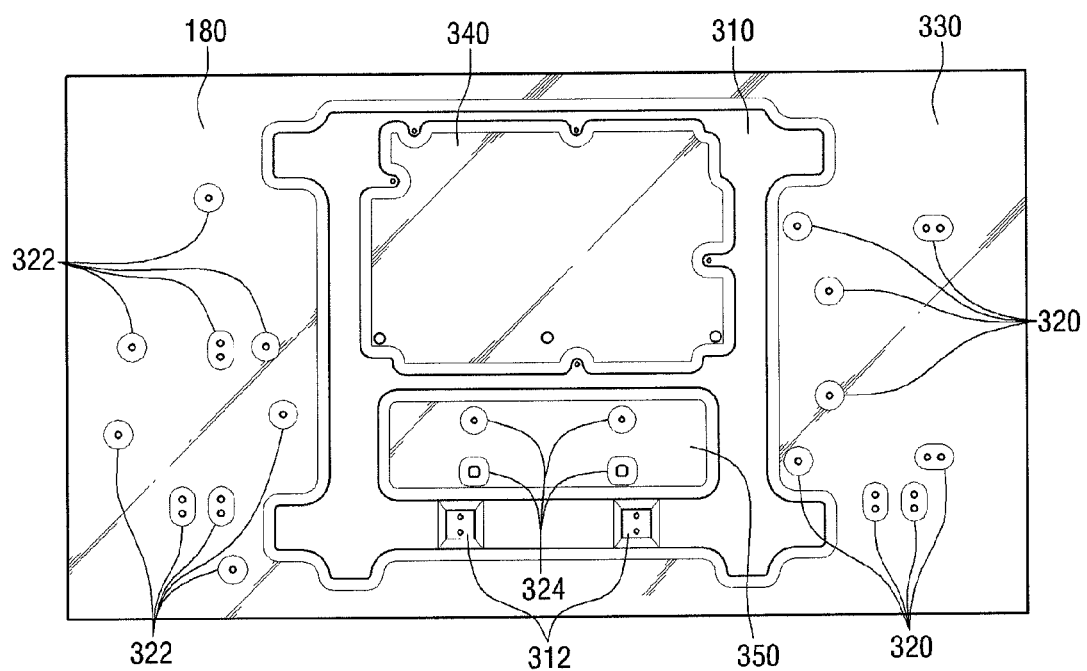
FIG. 3 illustrates a front surface of a base chassis.
Figure 4:
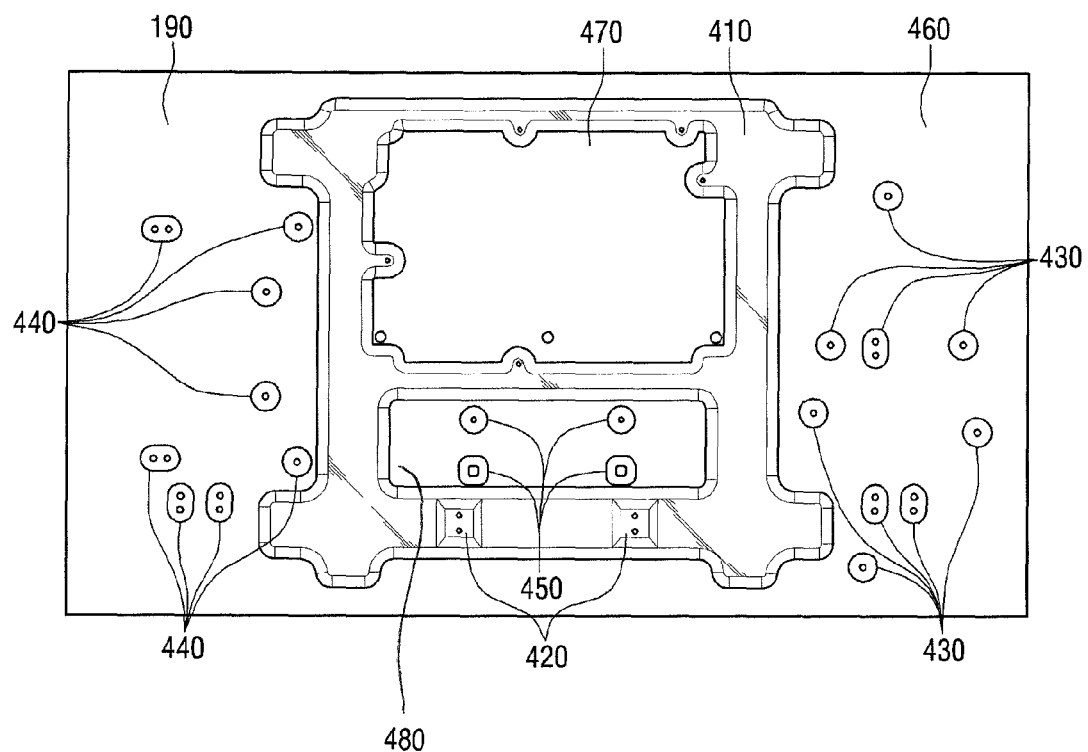
FIG. 4 illustrates a rear surface of the base chassis.

FIG. 3 the front surface of the base chassis 140, and FIG. 4 illustrates the rear surface of the base chassis 140.

The base chassis 140 is manufactured in a pressing manner, thereby including concave portions and convex portions. In particular, since the base chassis 140 includes holes through which screws penetrate, the base chassis 140 can be manufactured in a burring manner of the pressing manner.

The front surface 180 of the base chassis 140 is attached to the gasket 130. The front surface 180 of the base chassis 140 is flat and partially concave and includes concave portions 310, 312, 320, 322, 324 and convex portions 330, 340, 350. The panel 110 and the TSS 120 are positioned in front of the base chassis 140 through the gasket 130. The concave portions of the base chassis 140 are referred hereinafter to as concave areas.

The rear surface of the base chassis 140 is flat and partially convex and includes convex portions 410, 420, 430, 440, 450 and concave portions 460, 470, 480. The driving circuit 150 is connected to the base chassis 140 through the screw. The convex portions of the base chassis 140 are referred hereinafter to as convex areas. The convex portions 410, 420, 430, 440, 450 of the rear surface 190 correspond to respective matching concave portions 310, 312, 320, 322, 324 of the front surface 180. The concave portions 460, 470, 480 of the rear surface 190 correspond to respective matching convex portions 330, 340, 350 of the front surface 180.

Returning to FIGS. 1 and 2, the driving circuit 150 may include an X driving circuit 210, a Y driving circuit 220, an address driving circuit 230, a power supply circuit 240, and a control circuit 250 as illustrated in FIG. 2. The X driving circuit 210, the Y driving circuit 220, and the address driving circuit 230 transmit an X electrode driving signal, a Y electrode driving signal, and an address electrode driving signal to the X electrodes, the Y electrodes, and the address electrodes respectively to drive the panel 110.

The driving circuit 150 is disposed on the rear surface 190 of the base chassis 140. Detailed description is provided with reference to FIG. 5.

Figure 5:
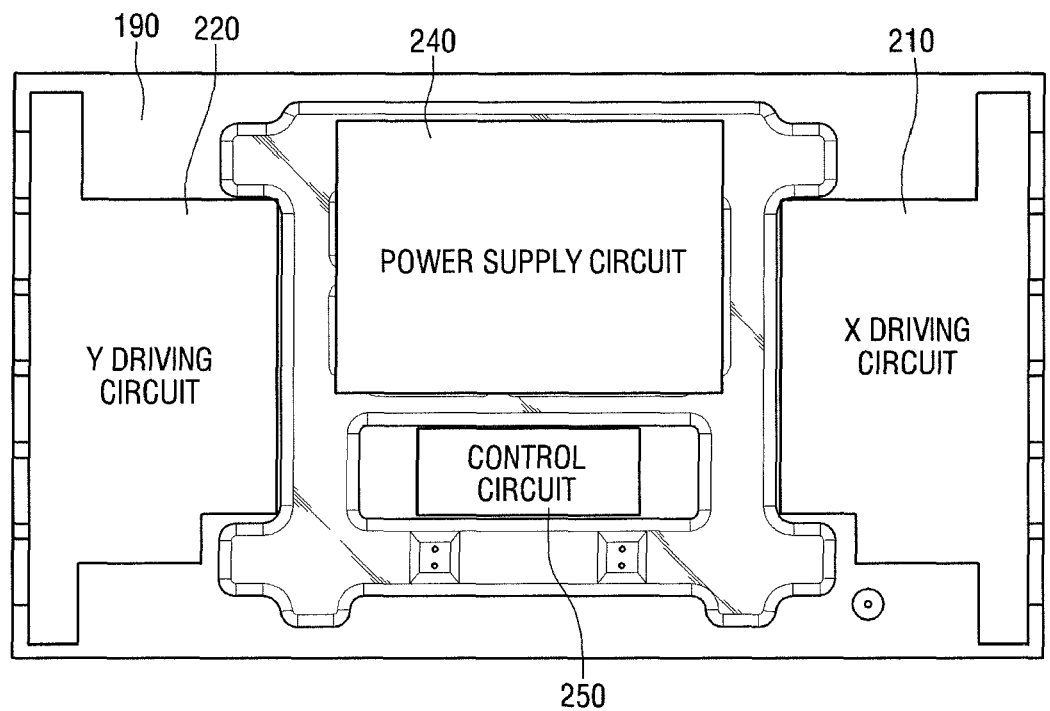
FIG. 5 illustrates a driving circuit which is attached to the rear surface of the base chassis.

FIG. 5 illustrates the driving circuit 150 which is attached to the rear surface 190 of the base chassis 140. In FIG. 5, the address driving circuit 230 is not illustrated for convenience of description. The driving circuit 150 is connected to the rear surface 190 of the base chassis 140 through the screw. The screw penetrates the driving circuit 150 and the base chassis 140 in sequence, and protrudes from the front surface 180 of the base chassis 140.

EMI is emitted from the screw protruding from the front surface 180 of the base chassis 140. In order to block EMI, the screw protrudes within a space formed by the concave areas of the base chassis 140 but does not protrude outside the space formed by the concave areas of the base chassis 140. The concave areas are covered by a conductor.

The detailed method for blocking EMI using the conductor is described below.

Returning to FIGS. 1 and 2, the cover 160 covers a portion of the front surface of the panel 110 and the side and the rear surface of the panel 110 to prevent damage of the panel 110 and the driving circuit 150. The cover 160 may block EMI emitted from the back of the plasma display apparatus 100, and may be thus formed of a conductive material.

EMI generated while the plasma display apparatus 100 is operating is emitted to the front surface 180 of the base chassis 140 through the screw. As the premise of the principle of generating EMI, a method for operating the plasma display apparatus 100 is described below with reference to FIG. 6.

Figure 6:
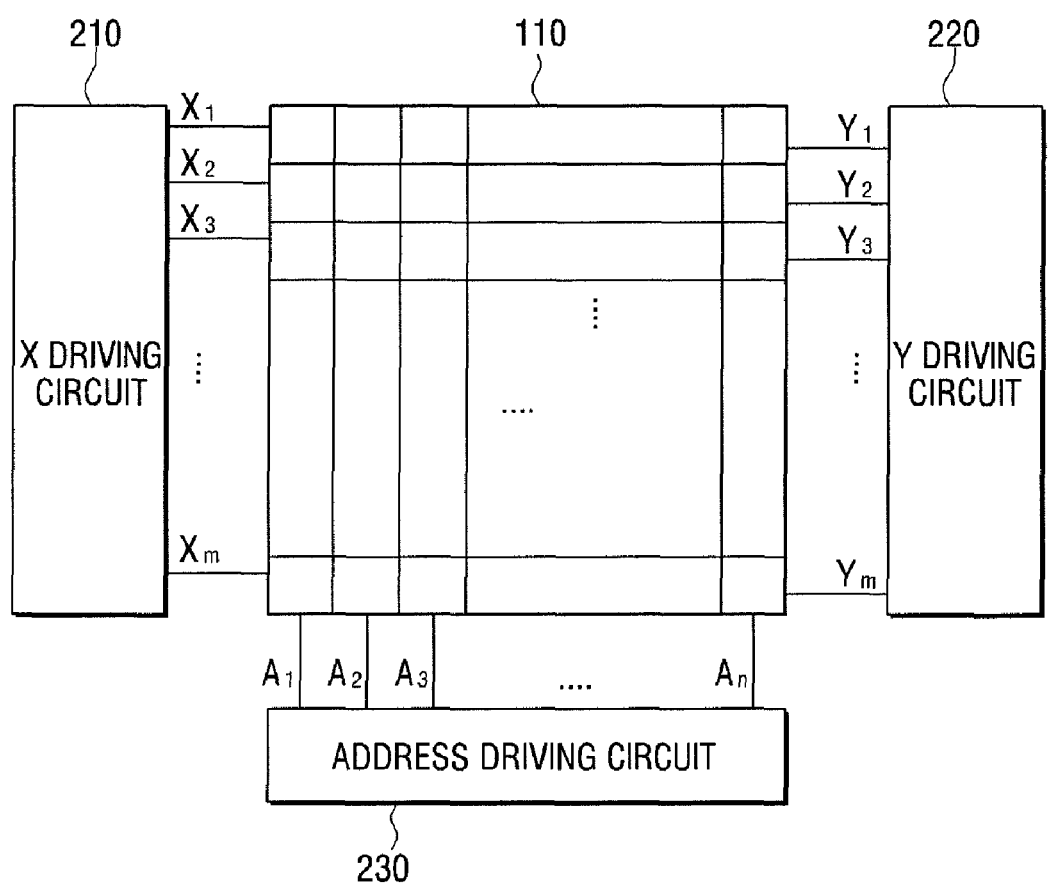
FIG. 6 illustrates a method for operating a plasma display apparatus.

FIG. 6 illustrates a method for operating the plasma display apparatus 100.

The panel 110 includes a plurality of pixels arranged in matrix form. In each pixel, an X electrode, a Y electrode, and an address electrode are formed. The panel 110 is operated in an address display separate (ADS) operating method in which the voltage is transmitted to each electrode so that each pixel emits light. In the ADS operating method, each sub-field of the panel 110 is divided into a reset section, an address section, and a sustain section.

The reset section eliminates previous wall charge state and sets up wall charges to perform the next address discharge stably. The address section selects turned-on cells and turned-off cells and stacks wall charges in the turned-on cells (addressed cells). The sustain discharge section alternately transmits the sustain voltage to the X electrode and the Y electrode and performs discharge to display an image on the addressed cells.

The X driving circuit 210 is connected to the X electrodes and transmits the driving voltage to the X electrodes to operate the panel 110. The Y driving circuit 220 is connected to the Y electrodes and transmits the driving voltage to the Y electrodes to operate the panel 110. In particular, the X driving circuit 210 and the Y driving circuit 220 perform sustain discharge of a selected pixel by inputting the sustain voltage to the X electrodes and the Y electrodes alternately.

The address driving circuit 230 transmits a data signal to select a pixel on which an image is displayed to an address electrode. The X electrodes and the Y electrodes are at right angles to the address electrodes, and face each other having a discharge space therebetween. The discharge space in which the X electrodes, the Y electrodes, and the address electrodes cross one another forms the discharge cells.

In order to operate the panel 110, the X driving circuit 210, the Y driving circuit 220, and the address driving circuit 230 apply a high voltage of approximately 200V and a root mean square (RMS) current of greater than 2 A to each electrode, so when the plasma display apparatus 100 operates, energy of driving waves to generate discharge emits EMI using the screw, which connects the driving circuit 150 with the base chassis 140, and acts as an antenna.

The process and principle of emitting EMI are described with reference to FIG. 7.

Figure 7:
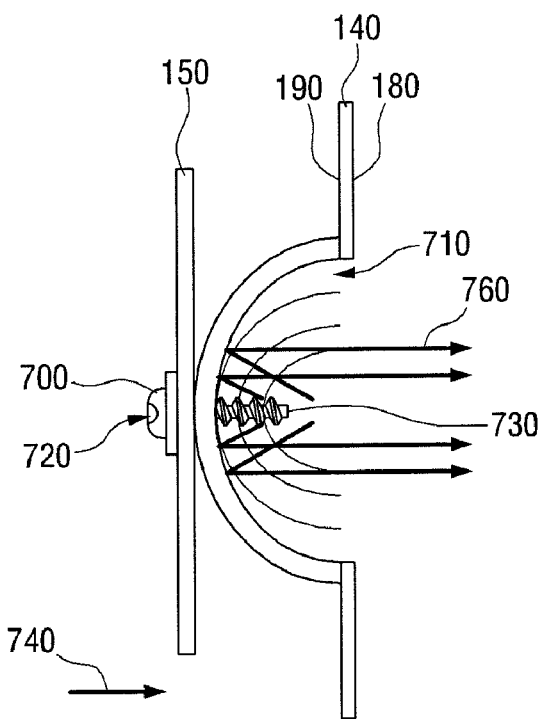
FIG. 7 illustrates a process of emitting EMI through a screw.

FIG. 7 illustrates a process of emitting EMI through the screw. As illustrated in FIG. 7, the driving circuit 150 is disposed at the rear surface 190 of the base chassis 140, and is connected to the base chassis 140 through the conductive screw 700. The conductive screw 700 is inserted from a side of the driving circuit 150 into the base chassis 140, and protrudes into the concave area 710 of the front surface 180 of the base chassis 140.

When the driving circuit 150 generates driving energy to drive the plasma display apparatus 100, EMI is caused and transmitted from the driving circuit 150 to the conductive screw 700. In particular, EMI moves from a head 720 to a tail 730 of the conductive screw 700 in a direction 740 and is emitted in the air.

Due to the structural feature of the concave area 710 of the front surface 180 of the base chassis 140, the conductive screw 700 has the characteristics of a parabolic antenna. Accordingly, EMI moving from the head 720 to the tail 730 of the conductive screw 700 reflects off the concave area 710 of the front surface 180 of the base chassis 140 and is emitted from the front surface 180 of the base chassis 140, as illustrated in FIG. 7 by arrows 760.

To solve this problem, in this exemplary embodiment, the concave area 710 is covered by a conductor 800. Detailed description is provided with reference to FIG. 8.

Figure 8:
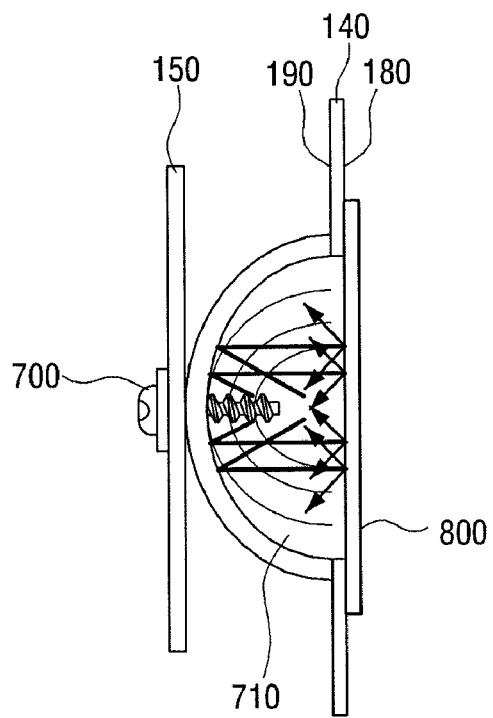
FIG. 8 illustrates a concave area covered by a conductor.

FIG. 8 illustrates a concave area 710 covered by a conductor 800. The conductor 800 covers the concave area 710 on the front surface 180 of the base chassis 140, so EMI emitted from the conductive screw 700 can be stuck in a space formed by the concave area 710.

In particular, the conductor 800 reflects, multi-reflects, or absorbs the EMI so that EMI may be trapped in the space formed by the concave area 710.

In order to minimize the thickness or the volume of the conductor 800, the conductor 800 may be formed as a conductive gasket tape, a copper tape, or a metal plate.

In addition, in order to fasten the base chassis 140 and the driving circuit 150 firmly, the screw 700 protrudes within the space formed by the concave area 710 but does not protrude outside the space. The reason why the screw 700 does not protrude outside the space formed by the concave area 710 is that if the screw 700 protrudes outside the space, the conductor 800 has to be formed in three dimensions to cover the concave area 710. That is, if the screw 700 protrudes outside the space, the entire thickness of the plasma display apparatus 100 may be larger due to the protruded screw 700 and the conductor 800 to cover the protruded screw 700 and the concave area 710. Therefore, the plasma display apparatus 100 cannot be lightweight and slim.

There may be a plurality of concave areas on the front surface 180 of the base chassis 140. In particular, as can be seen in FIGS. 4 and 5, concave areas may be disposed in portions in which the driving circuit 150 is mounted, and if necessary, may be disposed in other areas. Even if a concave area is disposed in a portion in which the driving circuit 150 is not mounted, the conductor 800 may cover only the portions in which the driving circuit 150 is mounted.

Although only one mounting screw 700 is illustrated, multiple mounting screws may be used. Accordingly, the concave areas into which the mounting screws protrude may be covered with the conductor or other means to reduce EMI emission. Also, only one or few of such concave areas may be covered.

Figure 9:
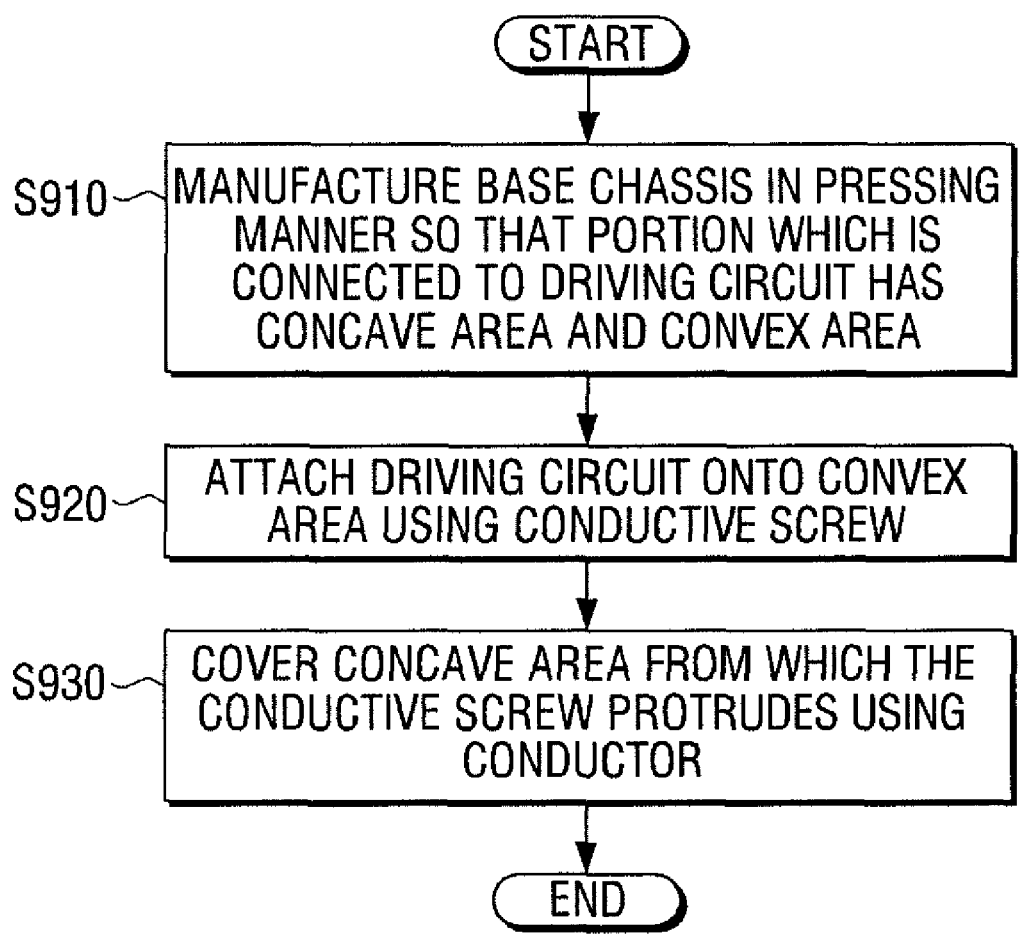
FIG. 9 is a flow chart illustrating a method for manufacturing a base chassis according to an exemplary embodiment.

FIG. 9 is a flow chart illustrating a method for manufacturing the base chassis 140 according to an exemplary embodiment.

The base chassis 140 is manufactured in a pressing manner so that a portion which is connected to the driving circuit 150 has a concave area and a convex area (S910).

Subsequently, the driving circuit 150 is mounted on the convex area using the conductive screw 700 (S920), and the concave area from which the conductive screw 700 protrudes is covered by the conductor 800 (S930).

The order of operations S920 and S930 may be reversed. That is, after the base chassis 140 is manufactured in a pressing manner (S910), the concave area is covered by the conductor 800 (S930) and then the driving circuit 150 is mounted on the convex area using the conductive screw 700 which protrudes within the space formed by the concave area (S920).

Accordingly, if the driving circuit 150 drives the panel 110, EMI emitted from the conductive screw 700 can be effectively blocked.

The effect of reducing EMI emission by covering the concave area using the conductor 800 is described with reference to FIG. 10. FIGS. 10A and 10B illustrate amounts of emitted EMI when the concave area is not covered and covered by the conductor 800.

Figure 10A:
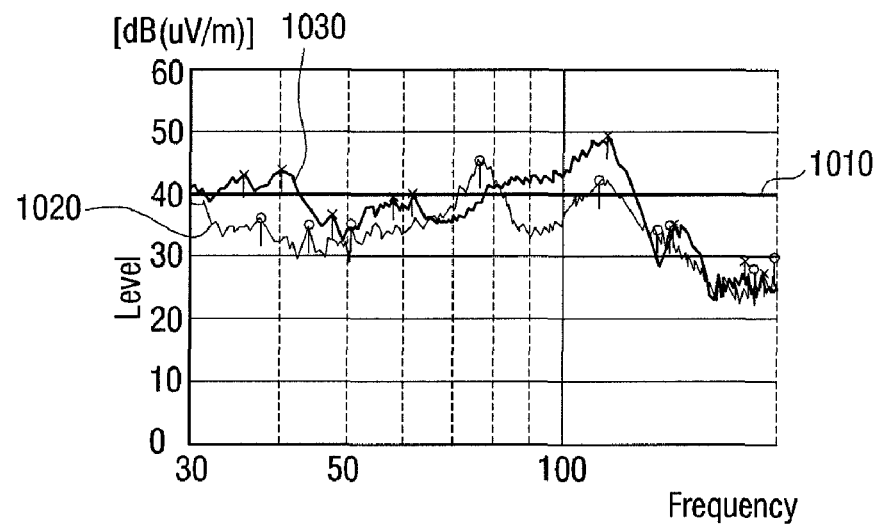
FIGS. 10A and 10B illustrate amounts of emitted EMI when the concave area is not covered and covered by the conductor.
Figure 10B:
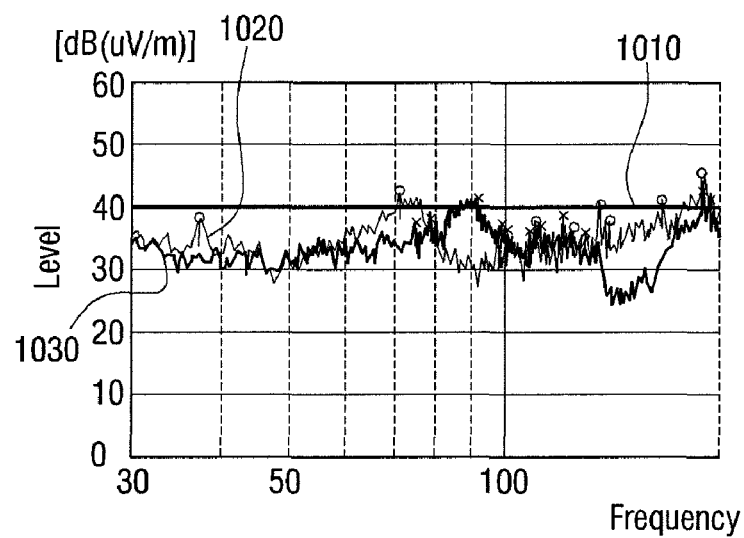

More specifically, in FIG. 10A, the graph shows the amount of emitted EMI when the concave area 710 is not covered by the conductor 800. In FIG. 10B, the graph shows the amount of emitted EMI when the concave area 710 is covered by the conductor 800.

The standard line 1010 indicates the standard of the amount of emitted EMI according to the international standard. The wave 1020 indicates values obtained by measuring EMI according to frequency based on the horizontal frequency, and the wave 1030 indicates values obtained by measuring EMI according to frequency based on the vertical frequency.

Therefore, the amount of emitted EMI based on the horizontal frequency or the vertical frequency is lower when the concave area 710 is covered by the conductor 800 than when the concave area 710 is not covered by the conductor 800. In particular, comparing the quasi-peak (QP) when the concave area 710 is covered by the conductor 800 with the QP when the concave area 710 is not covered by the conductor 800, the QP when the concave area 710 is covered by the conductor 800 is approximately 5 dB-10 dB lower than the QP when the concave area 710 is not covered by the conductor 800. The QP indicates the quasi-peak of the amount of emitted EMI.

As described above, if the conductor 800 covers the concave area 710, emission of EMI generated while the plasma display panel is operating can be effectively reduced.

In this exemplary embodiment, in order to reduce EMI generated when the base chassis 140 of the plasma display apparatus 100 is manufactured in a pressing manner, the conductor 800 is attached to the concave area 710, but this is merely an example. Technical idea of the inventive concept can be applied to base chasses used in other display apparatuses such as liquid crystal displays (LCDs).

Consequently, EMI emitted from the front surface of the base chassis can be effectively reduced. In particular, EMI can be reduced with simplified manufacturing process and low cost by not using stud manner but using a pressing manner.

The foregoing exemplary embodiments and advantages are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A display apparatus comprising:
    a display panel;
    a base chassis which is disposed on a surface of the display panel, includes a first surface having a convex area and a second surface opposite the first surface and having a concave area corresponding to the convex area of the first surface;
    a driving circuit which is connected to the display panel to operate the display panel;
    a connection element which attaches the driving circuit to the convex area of the first surface of the base chassis; and
    a conductor which is attached to the concave area of the second surface of the base chassis.

2. The display apparatus according to claim 1, wherein the conductor covers a space formed by the concave area and is attached to the concave area to block electromagnetic interference (EMI) emitted through the connection element.

3. The display apparatus according to claim 2, wherein the EMI is generated by the driving circuit when the driving circuit drives the display panel, and the EMI is transmitted to the connection element and is emitted via the connection element acting as an antenna.

4. The display apparatus according to claim 1, wherein the first surface of the base chassis comprises a plurality of convex areas and the second surface of the base chassis comprises a plurality of concave areas, and the conductor is attached to one of the plurality of the concave areas corresponding to one of the plurality of the convex areas to which the driving circuit is attached through the connection element.

5. The display apparatus according to claim 4, wherein the display apparatus comprises a plasma display apparatus, and the conductor is attached to the concave area corresponding to the convex area to which an X driving circuit and a Y driving circuit in the driving circuit are attached through the connection element.

6. The display apparatus according to claim 1, wherein the conductor includes at least one of a conductive gasket tape, a copper tape, and a metal plate.

7. The display apparatus according to claim 1, wherein the pressing manner is a burring manner.

8. The display apparatus according to claim 1, wherein the connection element comprises a conductive screw which is inserted from the convex area of the first surface into the concave area of the second surface, protrudes within a space formed by the concave area, and does not protrude outside the space formed by the concave area.

9. The display apparatus according to claim 1, wherein the base chassis is manufactured in a pressing manner to have a concave area and a convex area.

10. A base chassis which accommodates a display panel and a driving circuit of a display apparatus, the base chassis comprising:
    a first surface having a convex area in which the driving circuit is mounted through a connection element; and
    a second surface opposite the first surface and having a concave area which corresponds to the convex area and to which a conductor is attached to block electromagnetic interference (EMI) generated by the driving circuit when the EMI is emitted through the connection element.

11. The base chassis of claim 10, wherein the connection element is inserted from the convex area of the first surface, protrudes into the concave area of the second surface, and has the characteristics of a parabolic antenna to emit the EMI from the concave area.

12. A display apparatus, comprising:
    a display panel which produces an image;
    a base chassis, which supports the display panel and comprises a concave portion formed on a front surface proximate the display panel and a matching convex portion formed on a rear surface opposing the front surface;

a driving circuit, disposed at the rear surface of the base chassis, which generates power to operate the display panel;

a connection element which is inserted from the rear surface of the base chassis through the convex portion into the matching concave portion of the front surface of the base chassis and fixes the driving circuit to the base chassis; and an electromagnetic interference (EMI) blocking element, attached to the concave area, which covers an inner space of the concave portion to block the EMI emitted by the driving circuit through the connection element.

13. The display apparatus according to claim 12, wherein the display apparatus comprises a plasma display apparatus.

14. The display apparatus according to claim 12, wherein the EMI blocking element includes at least one of a conductive gasket tape, a copper tape, and a metal plate.

15. The display apparatus according to claim 12, wherein the base chassis is manufactured by pressing.

16. The display apparatus according to claim 12, wherein the connection element comprises a screw which does not protrude outside the inner space formed by the concave area.

* * * * *